United States Patent [19]

Cross

[11] Patent Number: 4,675,618

[45] Date of Patent: Jun. 23, 1987

[54] LINEARIZER CIRCUIT FOR FREQUENCY MODULATION OSCILLATOR

[75] Inventor: Richard A. Cross, Garland, Tex.

[73] Assignee: Rockwell International Corporation, El Segundo, Calif.

[21] Appl. No.: 871,963

[22] Filed: Jun. 9, 1986

[51] Int. Cl.[4] .............................................. H03C 3/08
[52] U.S. Cl. ........................................ 332/18; 332/21; 375/44; 375/58; 375/60; 455/42; 455/63
[58] Field of Search .......................... 332/18, 21, 30 V; 455/42, 43, 110, 113, 102, 63; 375/44, 58, 60

[56] References Cited

U.S. PATENT DOCUMENTS 3,353,117 11/1967 Renkowitz ...................... 331/113 R
4,003,004 1/1977 Fletcher et al. .................. 332/30 V Primary Examiner—Siegfried H. Grimm
Attorney, Agent, or Firm—Bruce C. Lutz; V. L. Sewell; H. Fredrick Hamann

[57] ABSTRACT

A system for frequency modulation by a signal, the system including an oscillator having a known linearity distortion, a circuit for selecting one from a plurality of predetermined constants, a circuit for operating on the signal with the selected constant, and a digital to analog converter in an embodiment where the signal is digital, for converting the signal having been operated on to an analog signal for modulating the oscillator is disclosed. One embodiment includes a circuit for determining the magnitude of the input signal.

8 Claims, 2 Drawing Figures

LINEARIZER CIRCUIT FOR FREQUENCY MODULATION OSCILLATOR

DESCRIPTION

1. Technical Field

The present invention relates to frequency modulation systems and particularly to linearizers for use in frequency modulating systems with direct modulated microwave oscillators.

It is common in frequency modulated microwave systems to use oscillators such as Gunn effect oscillators. It is typical for such an oscillator to operate in the 18 gigahertz range where it maintains the licensed to transmit frequency by means of automatic frequency control. Such circuits have characteristic nonlinearity where the frequency excursion of the output is not only not proportional to that of the input, but frequently the amount of frequency excursion in one direction for a given input magnitude is not the same as the frequency excursion in the opposite direction for the same magnitude of input.

2. Background Art

In the past, there have been attempts to correct oscillator nonlinearity by shaping the non-equalized frequency versus voltage response of the oscillator circuit by such means as using resonant circuits in the oscillator itself.

It has also been attempted to predistort the signal prior to the oscillator in order to compensate for the nonlinearity of the oscillator. Such systems operate by the use of carefully selected diodes, taking advantage of the non-linear characteristics of the diodes. Direct current potentiometers are typically used to control the diode bias.

To force the linearization of the Gunn oscillator itself increases cost dramatically, but operating on the input signal by taking advantage of the nonlinear characteristics of diodes also has numerous problems. Each diode must be carefully selected and then further compensated for by use of adjusting various direct current potentiometers. Diode characteristics then can change with age, defeating the initial individual adjustments. The types of diode characteristics are also limited.

3. Disclosure of Invention

In accordance with the present invention, one of a predetermined plurality of constants is selected according to the instantaneous value of the input signal. The input signal is then operated on mathematically using that constant in order to predistort the signal. In a preferred form, a device for preparing an electrical signal for frequency modulation by an oscillator having a known linearity distortion, includes means for determining the magnitude of the input signal, means responsive to the magnitude determining means for selecting one of a plurality of predetermined constants, and means for adding the selected constant to the signal.

One form of the invention for use with a signal originally in digital form includes a digital to analog converter for converting the sum of the digital signal and the selected constant to an analog signal to be modulated by the oscillator.

BRIEF DESCRIPTION OF DRAWINGS

The details of the invention will be described in connection with the accompanying drawing, in which.

BEST MODE FOR CARRYING OUT THE INVENTION

Figure 1:
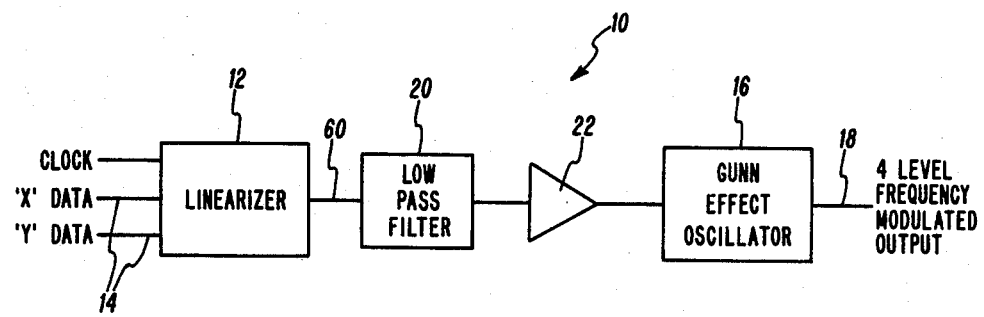
FIG. 1 is a diagrammatic view of a system for frequency modulation according to the present invention of a signal originally in digital form.

Referring now to the drawing, and in particular to FIG. 1, a system according to the present invention for frequency modulation is referred to generally by reference numeral 10. System 10 includes a linearizer 12 for predistorting digital input signal 14 to compensate for a known linearity distortion of a Gunn effect oscillator 16, wherein the frequency modulated output signal 18 is more linear than it would have been without the linearizer. In addition to including linearizer 12 and the Gunn effect oscillator 16, system 10 includes a low pass filter 20 for Nyquist filtering for the switching transition edges. An amplifier 22 helps isolate low pass filter 20 from Gunn effect oscillator 16 and provides any additional amplification of the predistorted signal if needed.

Figure 2:
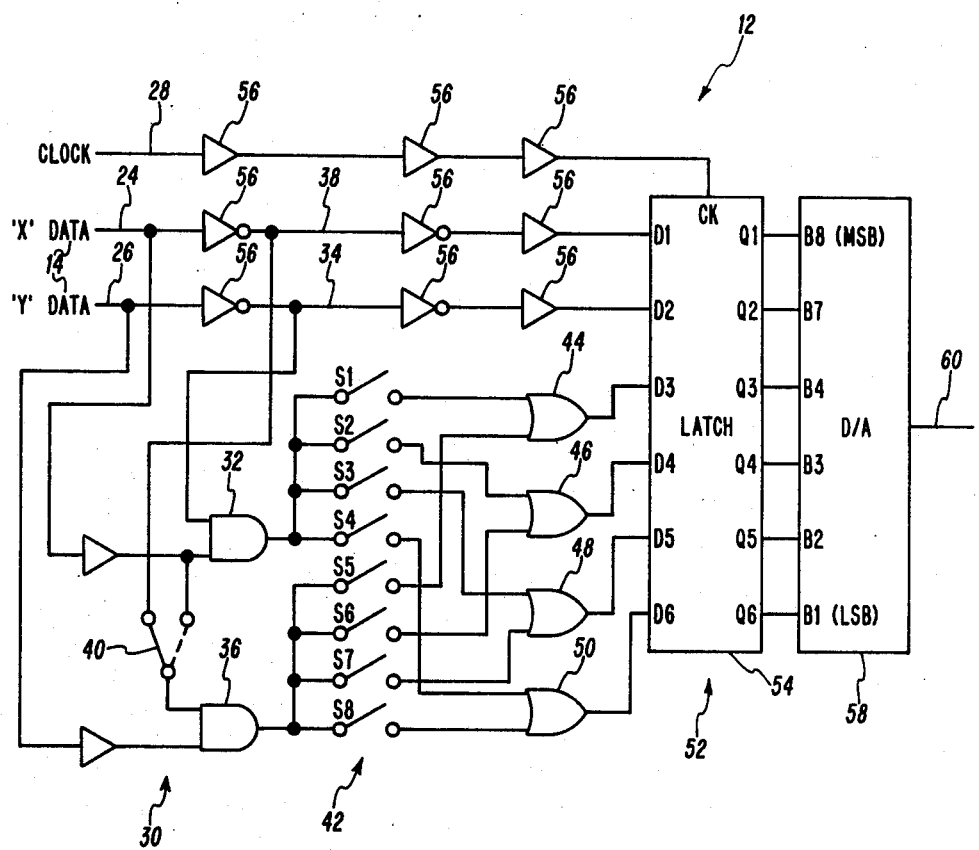
FIG. 2 is a diagrammatic view of a device according to the present invention for preparing an electrical signal for frequency modulation by an oscillator having a known linearity distortion.

Referring also to FIG. 2, input signal 14 includes two data rails 24 and 26 for "X" data and "Y" data respectively in addition to clock 28. At any given clock cycle, either data rail 24 or 26 can have a "0" or a "1" value so that there are four possible magnitudes of digital signal at any given time. Linearizer 12 includes means 30 for determining the magnitude of digital signal 14. Means 30, in the embodiment illustrated, includes AND gate 32 for ANDing X data 24 with NOT Y data 34. Means 30 also includes AND gate 36 for ANDing Y data 26 with either NOT X data 38 or X data 24 according to which way a strap 40 is connected.

Linearizer 12 also includes means 42 for selecting one of a plurality of predetermined constants according to the magnitude of digital signal 14. Means 42 includes eight programmable switches S1–S8 which can be programmed to determine the magnitude of the steps used for compensating for the nonlinearity of Gunn effect oscillator 16. Strap 40 of means 30 determines which steps receive compensating changes, but switches S1–S8 determine the amount of change. Means 42 also includes OR gates, 44, 46, 48 and 50. Since switches S1–S4 are connected directly to the output of AND gate 32, and switches S5–S8 are connected directly to the output of AND gate 36, and each OR gate 44, 46, 48 and 50 has one input connected to one switch associated with the output of AND gate 32 and another input connected to a switch associated with the output of AND gate 36, it can easily be seen that the outputs of the OR gates can be readily programmed by programmable switches S1–S8 and are responsive to the magnitude of input data 14.

Linearizer 12 also includes means 52 responsive to magnitude determining means 30 for mathematically operating on the input signal with the constant selected from the predetermined plurality of constants by means 42. In the particular embodiment illustrated, means 52 includes a latch 54 along with suitable stages of delay 56 for clock signal 28, X data signal 24 and Y data signal 26. Delay stages 56 can also include signal inverting where necessary to provide clock and data of the right polarity and substantially equally delay at latch 54. In the embodiment illustrated, three stages of delay 56 correspond to the two stages of delay in means 30 added to the one stage of delay in means 42. X data 24 is supplied as the most significant bit to input D1 of latch 54, and Y data 26 is supplied as the second most significant bit of data to input D2 of latch 54. The output signals of OR gates 44, 46, 48 and 50 are supplied as the four least significant bits in descending order to latch inputs D3, D4, D5 and D6 respectively. It is thus seen that the constant selected by means 42 is added as the four least significant bits by latch 54 to a number whose two most significant bits are represented by the X and Y data. Clock data 28 clocks the data at inputs D1-D6 to outputs Q1-Q6 respectively. Those outputs in turn go to inputs B8, B7 and B4-B1 in descending order of a digital to analog converter 58. Digital to analog converter 58 converts the sum of digital signal 14 and the selected constant into an analog signal 60 for modulating oscillator 16. The addition of the constant predistorts the signal 14 into the signal as represented at 60 to compensate for the known linearity distortion of the oscillator.

By way of example, if strap 40 is connected from the input of AND gate 36 to NOT X data 38 and all switches S1-S8 are programmed to be closed, then for X=0 and Y=0, the output of AND gate 32 and the output of AND gate 36 are both 0 so that the output of OR gates 44, 46, 48 and 50 are all 0. Thus, the inputs to all gates D1-D6 of latch 54 are 0, and when clocked, the inputs to gates B8-B1 of digital to analog converter 58 are also all 0.

If Y is changed to a 1, then D2 and B7 become 1's. Similarly, since Y is now a 1 and NOT X is a 1, the output of AND gate 36 is a 1 so that all four OR gates have a 1 output. B7 and B4-B1 are all 1 with B8 at 0. By similar logic, if X is a 1 and Y is a 0, then B8 and B4-B1 are all at 1 with B7 at 0. If both X and Y are 1, then B8 and B7 are at 1, but B4-B1 are at 0 since the outputs of AND gates 32 and 36 are at 0.

It is easy to see that the result of the example would be different if strap 40 connected X data 24 to the input of AND gate 36. In such an example, with both X=0 and Y=0, gates B8, B7 and B4-B1 would also all be 0, but unlike the previous example, if Y is changed to a 1, only B7 goes high. If X=1 and Y=0, then B8 and B4-B1 are all high, but B7 is low. Similarly, if both X and Y are high, then B8, B7 and B4-B1 are all high.

From the foregoing, it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

I claim:

1. A system for frequency modulation by a signal originally in digital form, comprising in combination:
   an oscillator to be frequency modulated, the oscillator having a known linearity distortion;
   means for selecting one of a plurality of predetermined constants according to the magnitude of the digital signal;
   means for adding the constant selected from the predetermined plurality of constants to the digital signal; and
   a digital to analog converter for converting the sum of the digital signal and the selected constant to an analog signal for modulating the oscillator, wherein the addition of the constant predistorts the signal to compensate for the known linearity distortion of the oscillator.

2. A system according to claim 1 further comprising:
   means for determining the magnitude of the digital signal, wherein the constant generating means is responsive to the magnitude determining means.

3. A system according to claim 2 further including a low pass filter for filtering the analog signal before it modulates the oscillator.

4. A system according to claim 1 further including a low pass filter for filtering the analog signal before it modulates the oscillator.

5. A system for frequency modulation by an input signal, comprising in combination:
   an oscillator to be frequency modulated, the oscillator having a known linearity distortion;
   means for determining the magnitude of the input signal; and
   means responsive to the magnitude determining means for mathematically operating on the input signal with one of a predetermined plurality of constants according to the magnitude of the input signal wherein the mathematical operation and the seclected constant from the plurality of the constants predistorts the signal input to the oscillator to compensate for the known linearity distortion.

6. A system according to claim 5 wherein the oscillator is a Gunn effect oscillator.

7. A device for preparing an electrical input signal for frequency modulation of an oscillator having a known linearity distortion, comprising in combination:
   means for determining the magnitude of the input signal;
   means responsive to the magnitude determining means for selecting one of a plurality of predetermined constants; and
   means for mathematically operating on the input signal with the selected constant wherein the mathematical operation and the selected constant predistort the input signal to compensate for the known linearity distortion.

8. A system according to claim 7 wherein the mathematical operation is addition.

* * * * *